(12) United States Patent
Hussell et al.

(10) Patent No.: US 9,590,155 B2
(45) Date of Patent: Mar. 7, 2017

(54) LIGHT EMITTING DEVICES AND SUBSTRATES WITH IMPROVED PLATING

(71) Applicant: Cree, Inc., Durham, NC (US)

(72) Inventors: Christopher P. Hussell, Cary, NC (US); Jesse Colin Reiherzer, Wake Forest, NC (US); Erin Welch, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 328 days.

(21) Appl. No.: 13/828,895

(22) Filed: Mar. 14, 2013

(65) Prior Publication Data

US 2013/0328070 A1 Dec. 12, 2013

Related U.S. Application Data

(60) Provisional application No. 61/656,312, filed on Jun. 6, 2012.

(51) Int. Cl.
| | |
|---|---|
| *H01L 33/62* | (2010.01) |
| *H01L 33/60* | (2010.01) |
| *H05K 3/24* | (2006.01) |
| *H01L 25/075* | (2006.01) |
| *H01L 33/64* | (2010.01) |

(52) U.S. Cl.
CPC .............. *H01L 33/62* (2013.01); *H01L 33/60* (2013.01); *H05K 3/244* (2013.01); *H01L 25/0753* (2013.01); *H01L 33/641* (2013.01); *H01L 2224/48091* (2013.01); *H01L 2224/48137* (2013.01); *H01L 2933/0033* (2013.01); *H05K 2201/0341* (2013.01); *H05K 2201/099* (2013.01); *H05K 2201/10106* (2013.01); *H05K 2201/2054* (2013.01); *H05K 2203/073* (2013.01); *H05K 2203/1461* (2013.01)

(58) Field of Classification Search
CPC ... H01L 2224/48091; H01L 2924/0002; H01L 2924/00; H01L 2924/00014; H01L 2224/48137; H01L 2224/48247; H01L 2224/8592; H01L 33/44; H01L 33/486; H01L 33/507; H01L 33/58; H01L 33/60; H01L 33/62
USPC ............ 257/88, E21.499, E21.592, E33.059, 257/E33.067, 81, 89, 98, 99; 428/172, 428/336, 434, 447, 457
See application file for complete search history.

(56) References Cited

U.S. PATENT DOCUMENTS

| | | |
|---|---|---|
| 4,946,547 A | 8/1990 | Palmour |
| 5,200,022 A | 4/1993 | Kong |
| RE34,861 E | 2/1995 | Davis |
| 6,514,782 B1 * | 2/2003 | Wierer, Jr. .......... H01L 25/0753 257/13 |

(Continued)

*Primary Examiner* — William F Kraig
*Assistant Examiner* — Edward Chin
(74) *Attorney, Agent, or Firm* — Jenkins, Wilson, Taylor & Hunt, P.A.

(57) ABSTRACT

Light emitting devices and substrates are provided with improved plating. In one embodiment, a light emitting device can include a submount and one or more light emitting diodes (LED) chips disposed over the submount. In one embodiment, the submount can include a copper (Cu) substrate, a first metallic layer of material that is highly reflective disposed over the Cu substrate for increased brightness of the device, and a second metallic layer disposed between the Cu substrate and the first metallic layer for forming a barrier therebetween.

13 Claims, 10 Drawing Sheets

(56) References Cited

U.S. PATENT DOCUMENTS

| | | | | |
|---|---|---|---|---|
| 6,989,294 B1* | 1/2006 | McLellan | ............ | H01L 21/4832 257/E23.124 |
| 7,157,744 B2* | 1/2007 | Palmteer | ............... | H01L 33/486 257/414 |
| 7,291,866 B2* | 11/2007 | Oshio | .................... | H01L 33/647 257/99 |
| 8,058,088 B2 | 11/2011 | Cannon | | |
| 8,563,339 B2 | 10/2013 | Tarsa | | |
| 8,921,869 B2* | 12/2014 | Welch | ................. | H01L 25/0753 257/81 |
| 9,211,614 B2* | 12/2015 | Iseki | .................... | B23K 35/264 |
| 2004/0095763 A1* | 5/2004 | Guerrieri | ................ | F21V 29/83 362/240 |
| 2004/0140764 A1* | 7/2004 | Lin | .......................... | H01L 33/62 313/512 |
| 2004/0188836 A1* | 9/2004 | Key | .................. | H01L 23/49816 257/738 |
| 2004/0251828 A1* | 12/2004 | Tsukamoto | ............. | H01L 33/52 313/512 |
| 2006/0092618 A1* | 5/2006 | Tanaka | ................. | G02B 6/0056 362/19 |
| 2006/0186418 A1 | 8/2006 | Edmond | | |
| 2008/0173884 A1 | 7/2008 | Chitnis | | |
| 2008/0179611 A1 | 7/2008 | Chitnis | | |
| 2008/0258130 A1 | 10/2008 | Bergmann | | |
| 2008/0258158 A1* | 10/2008 | Yoneda | ............... | H01L 25/0753 257/88 |
| 2008/0303411 A1* | 12/2008 | Ohta | ...................... | C09K 11/02 313/503 |
| 2010/0038670 A1* | 2/2010 | Panaccione | .......... | G02B 6/0083 257/98 |
| 2010/0155763 A1 | 6/2010 | Donofrio | | |
| 2010/0213835 A1* | 8/2010 | Mo | ....................... | F21V 3/0409 313/512 |
| 2012/0205689 A1* | 8/2012 | Welch | ................. | H01L 25/0753 257/91 |
| 2012/0313131 A1* | 12/2012 | Oda et al. | ........................ | 257/98 |
| 2013/0020590 A1* | 1/2013 | Lin et al. | ........................ | 257/88 |

* cited by examiner

LIGHT EMITTING DEVICES AND SUBSTRATES WITH IMPROVED PLATING

CROSS-REFERENCE TO RELATED APPLICATION

This application relates and claims priority to U.S. Provisional Patent Application Ser. No. 61/656,312 filed Jun. 6, 2012, the content of which is incorporated by reference herein in its entirety.

TECHNICAL FIELD

The subject matter herein relates generally to light emitting devices and substrates. More particularly, the subject matter herein relates to light emitting devices and substrates with improved plating.

BACKGROUND

Light emitting diodes (LEDs) or LED chips, can be utilized in light emitting devices or packages for providing white light (e.g., perceived as being white or near-white), and are developing as replacements for incandescent, fluorescent, and metal halide high-intensity discharge (HID) light products. Conventional LED devices or packages can incorporate components such as metallic traces or mounting surfaces for facilitating passage of electrical signal or current to the LED chips. Such traces and/or surfaces may be plated with silver (Ag) and/or other metals for reflecting light emitted from the LED chips, thereby improving brightness of the device. Conventional devices are typically plated via an electrolytic silver plating technique over surfaces either before or after deposition of a reflective coating, such as a reflective solder mask.

There are several problems associated with conventionally plated devices and substrates. For example, if silver is plated after deposition of the solder mask, the cleaning and/or plating chemicals associated with conventional plating techniques can degrade or adversely affect the solder mask causing the solder mask to chip or flake away from the device. As the solder mask reflects light, this can adversely affect brightness of the device. In other aspects, where silver is plated before application of the solder mask, the 1solder mask can chip or flake away from device due to poor adhesion with the silver and thereby adversely affecting brightness of the device. Other problems associated with conventional plating of devices and/or substrates can include plating silver into areas where it may not need to be plated, which in addition to increasing production costs, may further require extra processing steps to remove the plated silver. For example, when using an electrolytic plating technique, silver may be plated over large areas or surfaces which are electrically charged to attract silver ions. Portions of the silver may require removal after plating. This can waste silver and contribute to an increased cost per device.

Despite the availability of various light emitting devices in the marketplace, a need remains for improved plating of devices and/or substrates within the devices and related methods. Such improvements can simplify and improve the manufacturing process of the light emitting devices as well as reduce the overall cost associated with such devices.

SUMMARY

In accordance with this disclosure, novel light emitting devices and substrates with improved plating are provided. It is, therefore, an object of the present disclosure herein to provide devices and substrates which utilize novel plating techniques and materials. For example, silver (Ag) can be plated via electrolytic, electroless, and/or immersion plating technique at different stages during the manufacturing process of devices disclosed herein. An optional nickel (Ni) barrier layer can be plated via an electroless process. In one aspect, plating techniques can advantageously plate Ag and Ni only in areas corresponding to portions of the device where it will ultimately remain and/or be required, thereby reducing waste. In addition, such plating can be performed prior to application of a solder mask, such that cleaning and/or plating chemicals do not degrade such components of LED devices described herein.

This and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
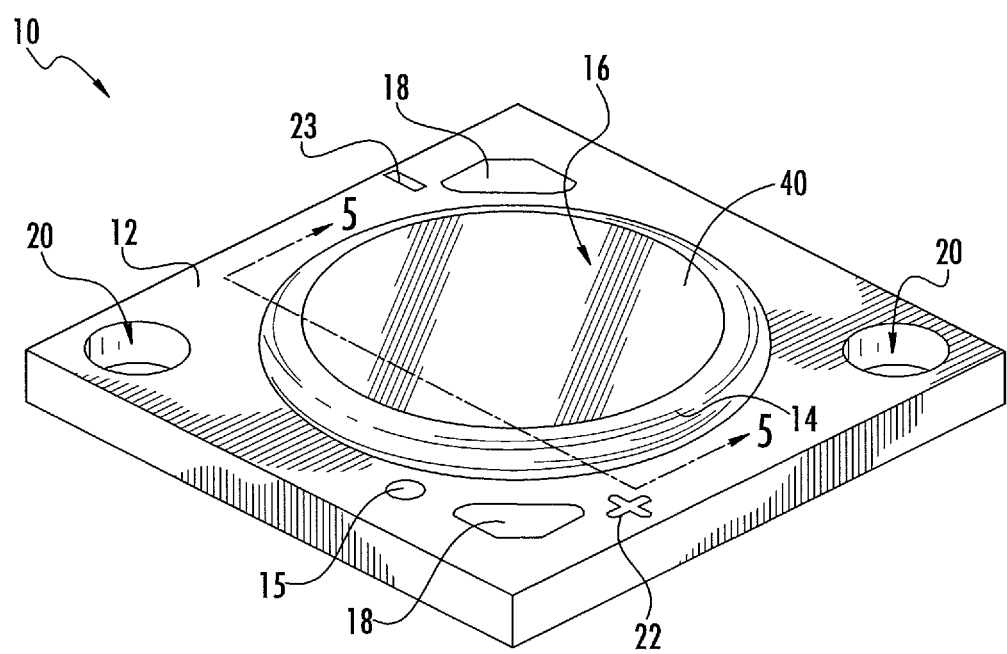
FIG. 1 is a top perspective view of a first embodiment of a light emitting diode (LED) device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As used herein the terms "barrier" and/or "barrier layer" refer to a layer of material that prohibits diffusion of one layer into another layer. That is, the barrier layer of material can be disposed between two layers, and atoms from each layer are prohibited from movement via diffusion across the barrier layer. The barrier layer can be can layer of material that prevents diffusion.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitting devices according to embodiments described herein can comprise group III-V nitride (e.g., gallium nitride (GaN)) based light emitting diodes (LEDs, i.e., LED chips) or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), GaN, and gallium arsenide (GaAs). In one aspect, SiC substrates/layers can be 4H polytype silicon carbide substrates/layers. Other Sic candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal chip (with or without the growth substrate), for example, can be flip chip bonded (e.g., using solder) to a carrier substrate or printed circuit board (PCB), or wire bonded. A vertical chip (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

One or more LED chips can be at least partially coated with one or more phosphors. The phosphors can absorb a portion of light emitted from the LED chip and emit a different wavelength of light such that the LED device or package emits a combination of light from each of the LED chip and the phosphor. In one embodiment, the LED device or package emits what is perceived as white light resulting from a combination of light emission from the LED chip and the phosphor. One or more LED chips can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LED chips of different colors, one or more of which can be white emitting.

Referring now to FIGS. 1 to 10B, the novel devices disclosed in FIGS. 1 through 7 and 9 through 10B provide context for further embodiments of the present subject matter which are described hereinafter. For example, such lighting devices shown and described in FIGS. 1 through 7 and 9 through 10B can incorporate one or more plated substrates as shown and described in FIGS. 8A to 8E below. FIGS. 1 to 5 illustrate different views of a first embodiment of an LED package or device generally designated 10. LED device 10 can comprise an SMD type device incorporating substrates plated via improved techniques during various processing steps in the manufacturing process as described herein. For example, LED device 10 can comprise substrates plated before deposition or application of solder mask, although a solder mask may not be required within the device. LED device 10 can comprise a submount 12 over which a retention material 14 is disposed about portions of an emission area, generally designated 16.

Figure 2:
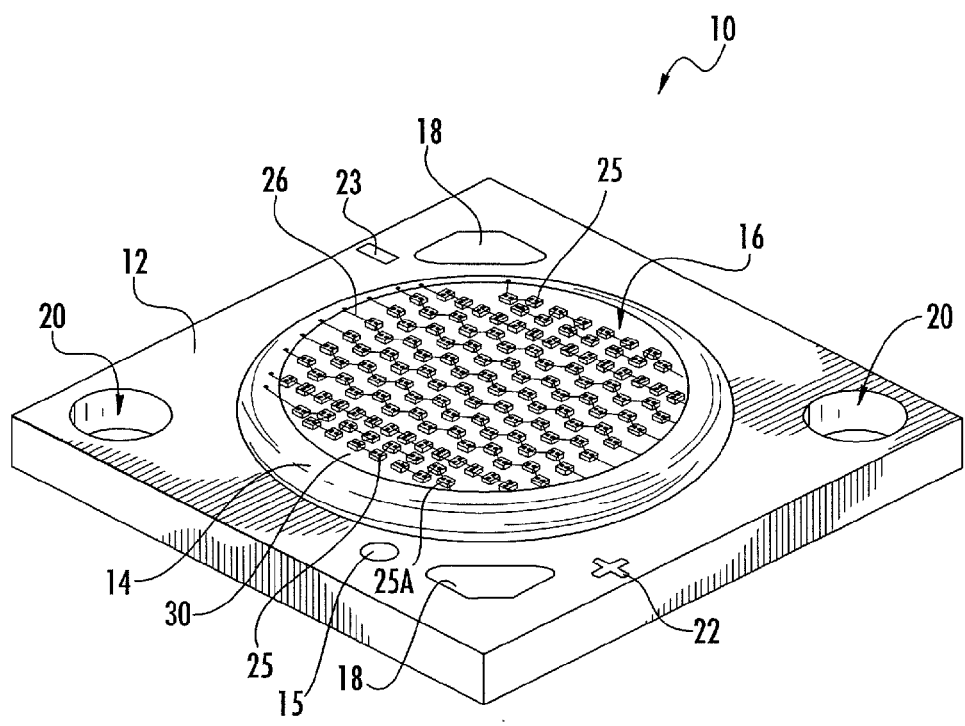
FIG. 2 is a top perspective view of the LED device according FIG. 1 without filling material according to the disclosure herein.
Figure 5:
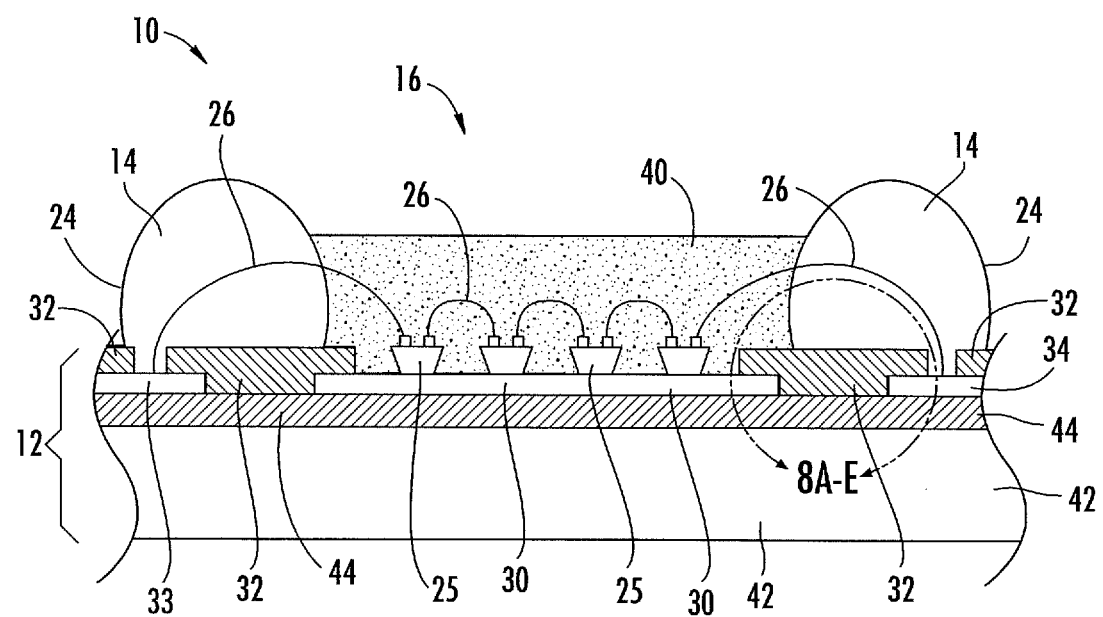
FIG. 5 is a cross-sectional view of the LED device according to FIG. 1 according to the disclosure herein.

In some aspects, emission area 16 can comprise one or more LED chips 25 disposed under a filling material 40 such as an encapsulant (see FIG. 5). FIGS. 1 and 2 are the same view of device 10, one difference being that FIG. 2 illustrates emission area 16 without filling material 40. In one aspect, emission area 16 can be substantially centrally disposed with respect to submount 12 of LED device 10. In the alternative, emission area 16 can be disposed at any location over LED device 10, for example, in a corner or adjacent an edge. Any location is contemplated, and more than one emission area 16 is also contemplated. For illustration purposes, a single, circular emission area 16 is shown; however, the number, size, shape, and/or location of emission area 16 can change subject to the discretion of LED device consumers, manufacturers, and/or designers. Emission area 16 can comprise any suitable shape such as a substantially circular, square, oval, rectangular, diamond, irregular, regular, or any asymmetrical shape.

Retention material 14 can be at least partially disposed about emission area 16 where retention material 14 can be referred to as a dam. Retention material 14 can comprise any material such as a silicone, ceramic, thermoplastic, and/or thermosetting polymer material. In one aspect, retention material 14 can comprise any suitable reflective material and can comprise a clear or opaque white material such as, for example, a silicone or epoxy material. Filler particles such as titanium dioxide ($TiO_2$), for example, can be used and added to retention material 14 for providing an opaque material. Retention material 14 can be dispensed or deposited in place via an automated dispensing machine where any suitable size and/or shape of dam can be formed. In one aspect, a circular shape as shown can be dispensed, although any other configuration could also be provided such as, for example, a square configuration, a rectangular configuration, a curved configuration, an irregular configuration, an asymmetric configuration, and/or any combination of desired configurations and cross-sectional shapes. As FIG. 5 illustrates in a cross-sectional view of LED device 10, retention material 14 can comprise a rounded outer wall 24 such that the upper surface of retention material 14 opposite submount 12 is rounded. In one aspect, retention material 14 is adapted for dispensing about emission area 16, which is advantageous as it is easy to apply and easy to obtain any desired size and/or shape while not being confined to a specific location over device 10.

Submount 12 can comprise any suitable mounting substrate, for example, a printed circuit board (PCB), a metal core printed circuit board (MCPCB), an external circuit, a dielectric laminate panel, a ceramic panel, an Al panel, AlN, $Al_2O_3$, or any other suitable substrate over which lighting devices such as LED chips may mount and/or attach. LED device 10 can comprise one or more openings or holes 20, disposed through submount 12 for facilitating attachment of LED device 10 to an external substrate or surface. LED device 10 can comprise first and second symbols 22 and 23 for denoting the electrical polarity of portions of LED device 10. For example, symbols 22 and 23 can denote the anode and cathode portions of LED device 10. LED device 10 can further comprise a test point 15 disposed adjacent the positive and/or negative side of the device for testing the electrical and/or thermal properties of LED device 10. LED device 10 can further comprise at least one electrical attachment surface 18 that can electrically connect to one or more external electrical components, such as external wires (not shown) or circuitry for facilitating the flow of electric current into and out of device 10. The electrical current can illuminate the one or more LED chips 25 (FIG. 2). Attachment surfaces 18 can physically and electrically connect to external electrical components such as wires (not shown) via welding, soldering, clamping, crimpling, inserting, or using any other suitable gas-tight solder free attachment method known in the art. That is, in some aspects, attachment surfaces 18 can comprise attachment devices configured to clamp, crimp, or otherwise attach to external wires (not shown).

Figure 3:
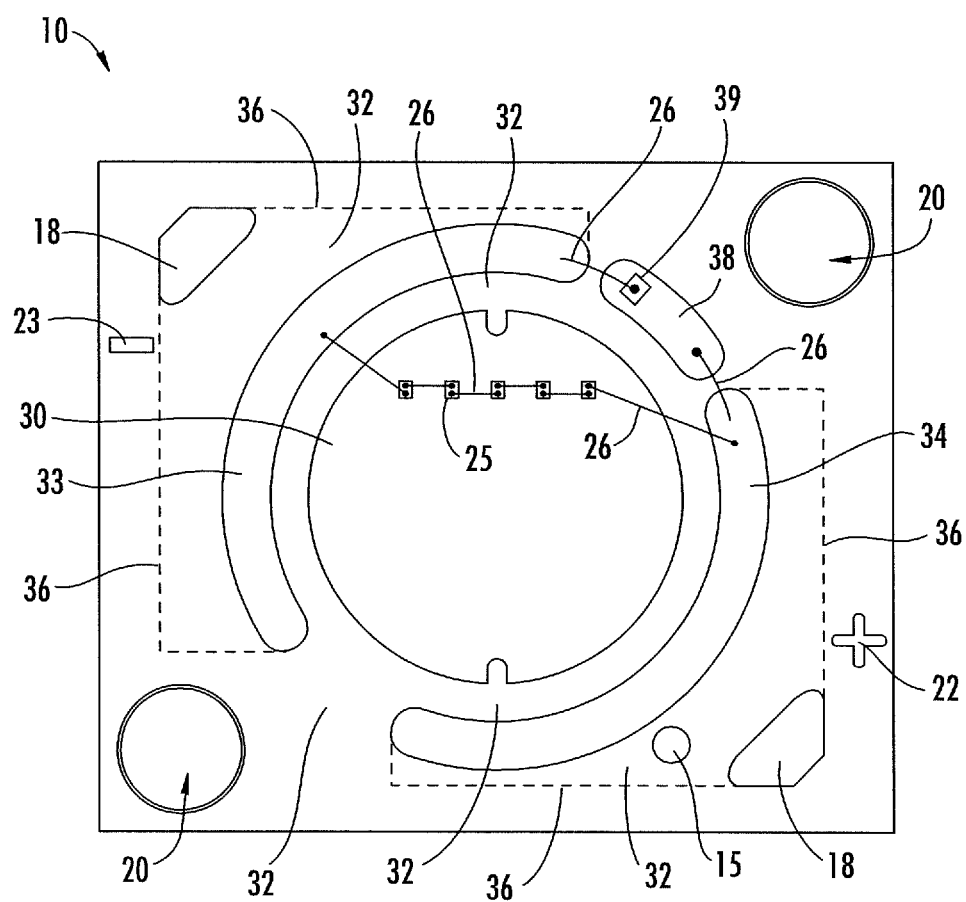
FIGS. 3 and 4 are top views of the LED device according to FIG. 1 illustrating plated portions of the device according to the disclosure herein.
Figure 4:
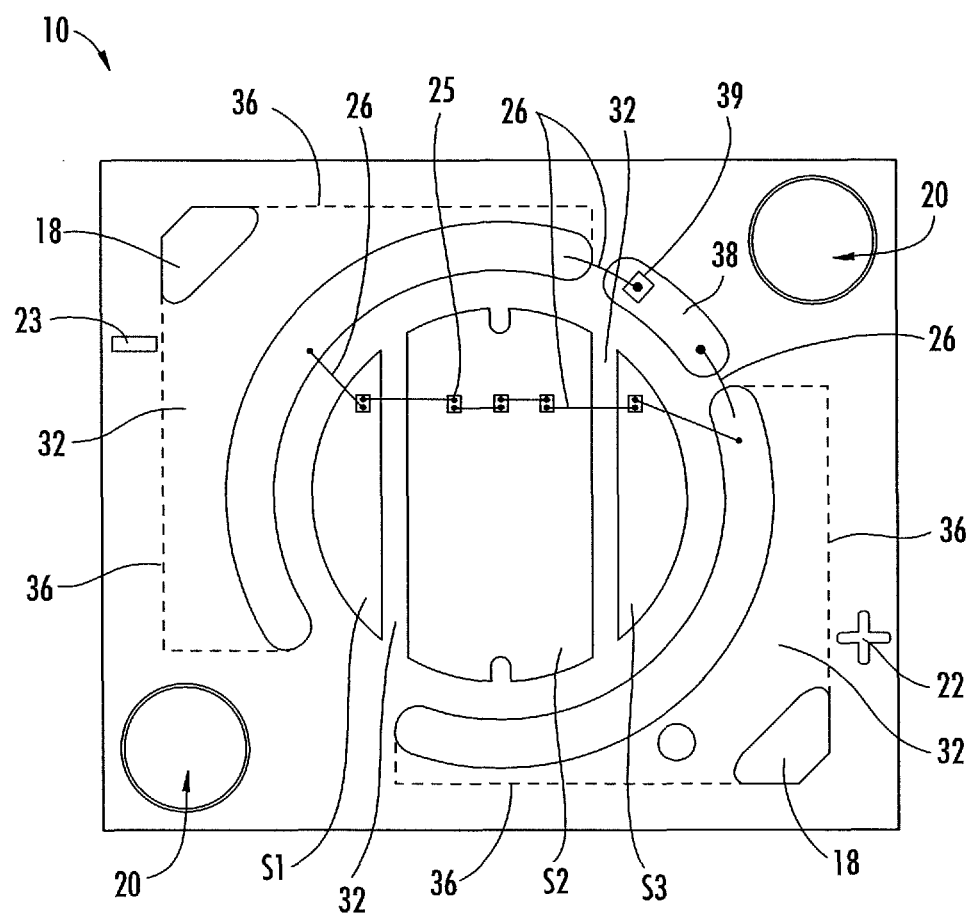

Referring to FIG. 2, LED chips 25 can be disposed over a conductive pad 30 of emission area 16 and can receive electrical current supplied and communicated via conductive traces 33 and 34 (FIGS. 3 to 5). LED chips 25 can be mounted to conductive pad 30 using any suitable die attach method(s) and/or material(s), for example and without limitation, an epoxy die attach (e.g., silicone or silver (Ag) epoxy) or a metal-to-metal die attach technique such as flux assisted eutectic, non-eutectic, or thermal compression die attach. LED chips 25 can comprise any suitable size and/or shape of chip and can be vertically structured (e.g., electrical contacts on opposing sides) or horizontally structured (e.g., contacts on the same side or surface). LED chips 25 can comprise any style of chip for example, straight cut and/or bevel cut chips, a sapphire, SiC, or GaN growth substrate or no substrate. One or more LED chips 25 can form a multi-chip array of LED chips 25 electrically connected to each other and/or electrically conductive traces 33 and 34 (FIGS. 3-5) in combinations of series and parallel configurations. In one aspect, LED chips 25 can be arranged in one or more strings, where each string can comprise more than one LED chip electrically connected in series. Strings of LED chips 25 can be electrically connected in parallel to other strings of LED chips 25. Strings of LED chips 25 can be arranged in one or more pattern as illustrated. LED chips 25 can be electrically connected to other LED chips in series, parallel, and/or combinations of series and parallel arrangements depending upon the application.

Referring to FIGS. 3 and 4, top views of LED device 10 are illustrated, prior to placement of retention material 14 and/or filling material 40. For illustration purposes, only a first string of LED chips 25 is illustrated, however, as noted earlier, emission area 16 can comprise more than one string of LED chips 25 electrically connected in series. FIG. 3 illustrates one possible location for conductive pad 30. That is, conductive pad 30 can, for example, comprise a substantially centrally located circular pad disposed between first and second conductive traces 33 and 34. Conductive pad 30, however, can be located at any suitable location over the substrate and any location other than substantially center of the device. Conductive pad 30 and first and second conductive traces 33 and 34 can comprise a layer of electrically conductive material such as copper (Cu).

In some aspects, conductive pad 30 and conductive traces 33 and 34 can comprise Cu substrates or components plated with silver (Ag) and optionally plated with a nickel (Ni) barrier layer disposed between the Cu and Ag as further described in FIGS. 8A to 8E. Notably, Ag can be plated via electrolytic, electroless, and/or immersion plating techniques at different stages during the manufacturing process of device 10. An optional Ni barrier layer can be plated via an electroless process. In one aspect, plating techniques can advantageously plate Ag and Ni only in areas corresponding to portions of the device where it will ultimately remain and/or be required, thereby reducing waste. In addition, such plating can be performed prior to application of solder mask 32, such that cleaning and/or plating chemicals do not degrade such components of LED device 10. In further aspects, plating techniques described herein can improve sulfur resistance of the device, by improving adhesion of the various layers within the device.

FIG. 4 illustrates an embodiment of LED device 10, where conductive pad 30 can comprise more than one electrically isolated section. For example and in one aspect, conductive pad 30 can comprise a first section S1, a second section S2 and a third section S3. Each section can comprise a Cu substrate, which can be plated with Ag via an immersion, electroless, and/or electrolytic plating process. For illustration purposes, only three sections (e.g., S1, S2, and S3) are shown, however, any number greater than one is contemplated herein and any configuration also. Of note, for electrolytic plating processes (e.g., requiring an electrical field), each section S1, S2, and S3 must be electrically charged (e.g., thereby becoming an electrical contact) for attracting and plating the Ag ions. As it may be difficult to electrically charge multiple sections of a device, immersion and/or electroless plating techniques may be preferred. Immersion and/or electroless plating techniques are not limited to plating to electrically charged substrates (e.g., as in electrolytic plating) and may be more efficient and therefore advantageous at plating multiple, electrically isolated sections of conductive pad 30 and/or traces 33 and 34.

Referring again to FIGS. 3 and 4, attachment areas 18 can electrically communicate to respective conductive traces 33 and/or 34. In one aspect, attachment areas 18 can comprise a Cu substrate that can be or have the same layer and/or same substrate as that of the Cu traces 33 and 34. One possible size and/or shape of the Cu substrate can be designated by broken lines 36. Such lines 36 are broken to indicate portions of the Cu substrate which can be disposed below a layer of solder mask 32. Attachment areas 18 can electrically connect to external wires (not shown) and can transfer electrical current received from such wires into and out of respective conductive traces 33 and 34. Conductive traces 33 and 34 can transfer electrical current into and out of one or more LED chips 25, or a string of LED chips 25, via electrical connectors such as wire bonds 26 thereby causing illumination of the one or more LED chips 25 or the string of LED chips 25. Conductive pad 30 (e.g., including sections S1, S2, and S3) can also comprise the same substrate or layer of Cu material as traces 33, 34 and attachment areas 18. However, traces 33 and 34 can be electrically isolated and physically separated from conductive pad 30 via etching or other Cu removal process.

Sections S1, S2, and/or S3 of conductive pad 30 can also be physically and electrical separated via etching or other Cu removal method. Attachment areas 18, traces 33 and 34, conductive pad 30, and test point 15 can comprise areas of exposed Cu. That is, attachment areas 18, traces 33 and 34, conductive pad 30, and test point 15 can comprise areas of Cu which are disposed on an upper surface of device 10 and which are not disposed below another layer of material, such as below a solder mask 32. Such exposed areas can physically and electrical connect to electrical components or devices, including but not limited to electrical wires (not shown), wire bonds 26, or LED chips 25 via wire bonding, soldering, and/or die attaching.

Still referring to FIGS. 3 and 4, solder mask 32 can be applied to areas that are disposed at least partially between respective conductive traces 33 and 34 and conductive pad 30 such that the solder mask 32 comprises a substantially circular arrangement about conductive pad 30. With respect to FIG. 4, solder mask 32 can be disposed between sections S1, S2, and S3. Solder mask 32 can be disposed in areas between attachment surfaces 18 and respective conductive traces 33 and 34 such that it is disposed over and/or above the Cu substrate, the size and shape of which is designated by broken lines 36. In one aspect, solder mask 32 can be reflective and electrically isolate the conductive traces 33, 34 from the environment. Thus, conventional devices which use cleaning and/or plating materials which weaken or degrade solder mask could result in solder mask 32 flaking or chipping off resulting in decreased brightness or areas of exposed Cu (also affecting brightness), and/or areas of Cu traces migrating into the Ag plating (e.g., the defect known as the red plague). Notably, plated devices, substrates and related methods disclosed herein can advantageously comprise substrates that are plated prior to or after deposition of solder mask using techniques which do not degrade the solder mask, and/or utilize an optional plated Ni barrier layer applied via an electroless plating technique. Such techniques can provide a barrier layer between the Cu and Ag, thereby preventing Cu atoms from migrating into the Ag plating.

LED device 10 can further comprise an electrically conductive mounting area 38 disposed in a gap between conductive traces 33 and 34. One or more electrostatic discharge (ESD) devices 39 can be mounted and reverse biased with respect to the one or more LED chips 25 to protect device 10 from ESD failures. ESD device 39 can electrically communicate with traces 33 and 34 via electrical connectors such as wire bonds 26. ESD devices 39 can comprise different elements such as various vertical silicon (Si) Zener diodes, different LED chips arranged reverse biased to LED chips 25, surface mount varistors and lateral Si diodes. ESD devices 39 are typically black and absorb light, as such, the devices can be covered and/or disposed under retention material 14.

As shown in FIG. 5, a filling material 40 can be disposed between inner walls of retention material 14. Filling material 40 can comprise an encapsulant having a predetermined, or selective, amount of one or more phosphors and/or lumiphors in an amount suitable for any desired light emission, for example, suitable for white light conversion or any given color temperature or color point. Filling material 40 can comprise a silicon encapsulant material, such as a methyl or phenyl silicone material or any other suitable material. Filling material 40 can interact with light emitted from the plurality of LED chips 25 such that a perceived white light, or any suitable and/or desirable wavelength of light, can be observed. Any suitable combination of encapsulant and/or phosphors can be used, and combinations of differently colored phosphors and/or LED chips 25 can be used for producing any desired color points(s) of light. Retention material 14 can be adapted for dispensing, positioning, damming, or placing, about at least a portion of emission area 16. After placement of retention material 14, filling material 40 can be selectively filled to any suitable level within the space disposed between one or more inner walls of retention material 14. For example, filling material 40 can be filled to a level equal to the height of retention material 14 or to any level above or below retention material 14. The level of filling material 40 can be planar or curved in any suitable manner, such as concave or convex (not shown).

FIG. 5 illustrates retention material 14 dispensed or otherwise placed over submount 12 after wire bonding the one or more LED chips 25 such that retention material 14 is disposed over and at least partially covers at least a portion of the wire bonds 26. For example, wire bonds 26 of the outermost edge LED chips in a given set or string of LED chips 25 can be disposed within retention material 14. For illustration purposes, only four LED chips 25 are illustrated and are shown as electrically connected in series via wire bonds 26, however, device 10 can contain many strings of LED chips 25 of any number, for example, less than four or more LED chips 25 can be electrically connected in series, parallel, and/or combinations of series and parallel arrangements. Strings of LED chips 25 can comprise diodes of the same and/or different colors, or wavelength bins, and different colors of phosphors can be used in the filling material 40 disposed over LED chips 25 that are the same or different colors in order to achieve emitted light of a desired color temperature or color point. LED chips 25 can mount or attach to conductive pad 30 or intervening layers (e.g., Ag or Ni plated layers, FIGS. 8A to 8E) disposed between LED 25 and conductive pad 30 using any die attach technique or materials as known in art and mentioned above, for example epoxy or metal-to-metal die attach techniques and materials.

LED chips 25 can be arranged, disposed, or mounted directly and/or indirectly over an electrically and/or thermally conductive pad 30 and electrically connected to first and second conductive traces 33 and 34. In one aspect, LED chips 25 are indirectly provided over conductive pad 30, as LED chips 25 may directly attach to one or more intervening layers (e.g., Ag or Ni, see layers 80 and 82, FIGS. 8A to 8E). One of first and second conductive traces 33 and 34 can comprise an anode and the other a cathode. As described earlier and in one aspect, conductive pad 30 and traces 33 and 34 can comprise an electrically and thermally conductive Cu substrate. Conductive pad 30 and traces 33 and 34 can comprise the same Cu substrate from which traces 33 and 34 have been singulated or separated from pad 30 via etching or other removal method. Prior to etching, one or more additional layers, such as a layer of Ag and/or Ni, can be plated via electrolytic, electroless, and/or immersion plating techniques, or combinations thereof, for improving the amount of light reflected from device (e.g., see FIGS. 8A to 8E). One etching process can be used for singulation of the plated traces 33 and 34 from pad 30 or multiple, differential etching processes can be used (e.g., see FIGS. 8C and 8D). In an alternative, one or more additional layers, such as a layer of Ag and/or Ni, can be plated via an electrolytic, electroless, and/or immersion plating technique after the Cu traces 33 and 34 have been singulated from pad 30 via etching, such that the Ag and/or Ni layers can be disposed about edges of Cu components (e.g., see FIG. 8B). After etching, an electrically insulating solder mask 32 can be applied such that it is at least partially disposed between conductive pad 30 and respective conductive traces 33 and 34. In one embodiment, a layer of Ag and/or Ni can be plated via electrolytic, electroless, and/or immersion techniques after application of solder mask 32 in areas outside of the solder mask 32 (e.g., see FIG. 8A).

FIG. 5 further illustrates a cross-section of submount 12 and emission areas 16 over which LED chips 25 can be mounted or otherwise arranged. Submount 12 can comprise, for example, conductive pad 30, first and second conductive traces 33 and 34, and solder mask 32 at least partially disposed between portions of conductive pad 30 and each of conductive traces 33 and/or 34. Conductive traces 33, 34 and conductive pad 30 can be plated with Ag and/or Ni as discussed and illustrated in FIGS. 8A to 8E. Submount 12 can further comprise a core layer 42 and a dielectric layer 44. Solder mask 32 can directly adhere to portions of dielectric layer 44. For illustration purposes, submount 12 can comprise a MCPCB, for example, those available and manufactured by The Bergquist Company of Chanhassan, Minn. Submount 12 can comprise any suitable material and/or layers or stacks of materials, however. Core layer 42 can comprise a conductive metal layer, for example copper or aluminum. Dielectric layer 44 can comprise an electrically insulating but thermally conductive material to assist with heat dissipation through submount 12. The layers and plating of layers within submount 12 circled detail 8A-E are discussed further below in FIGS. 8A to 8E.

Figure 6:
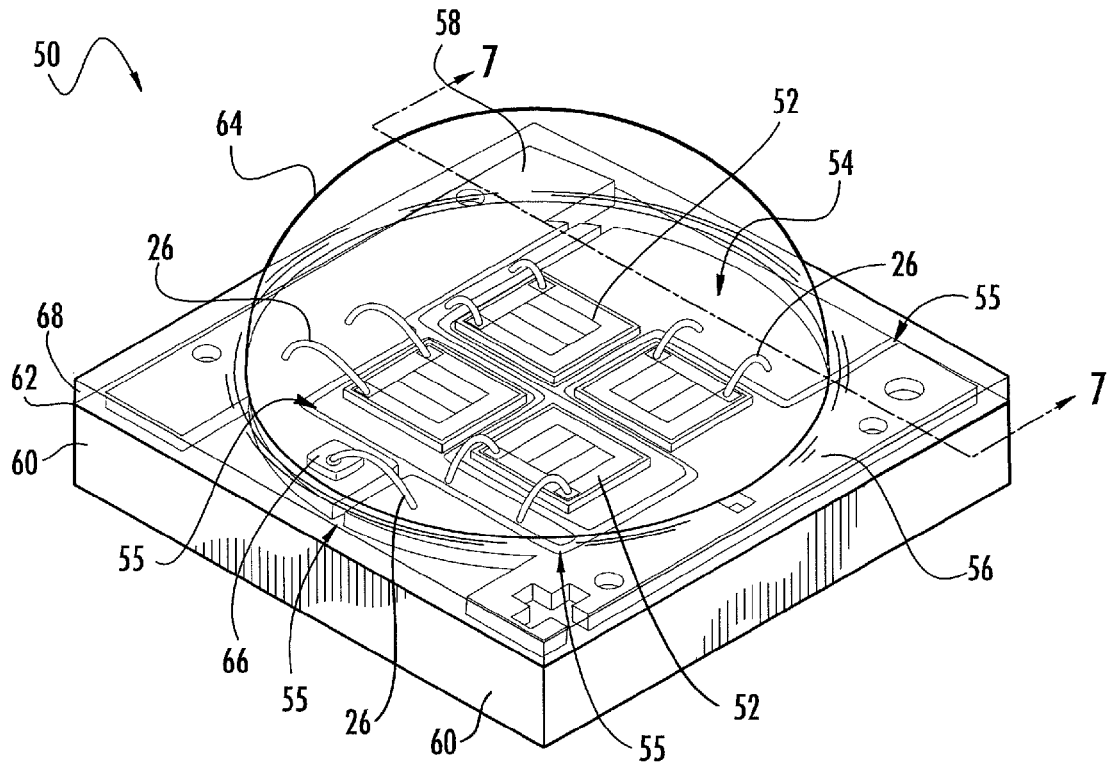
FIG. 6 is a top perspective view of a second embodiment of an LED device according to the disclosure herein.
Figure 7:
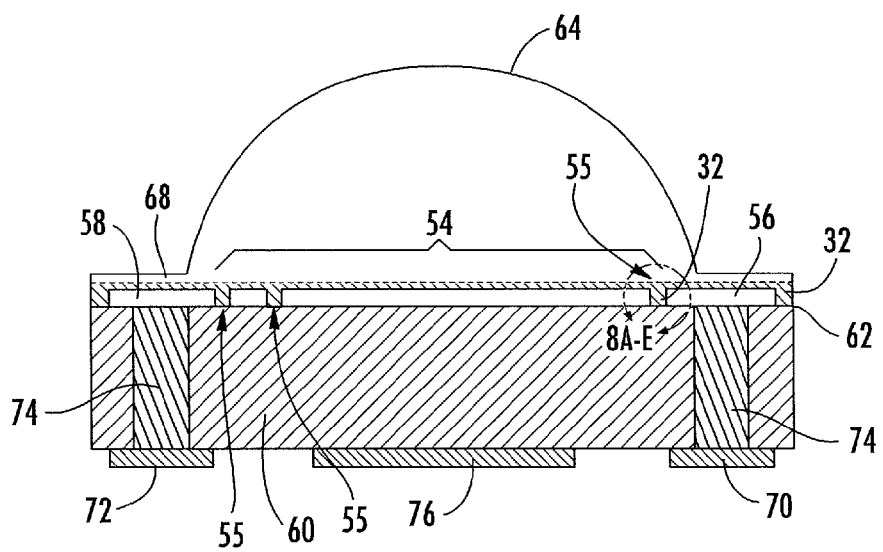
FIG. 7 is a cross-sectional view of the LED device according to FIG. 6 according to the disclosure herein.

FIGS. 6 and 7 illustrate further embodiments of an LED device generally designated 50 which can also incorporate substrates having improved plating. That is, plated devices and substrates disclosed herein can advantageously be plated prior to, during, and/or after deposition of solder mask using techniques which do not degrade the solder mask, and/or which utilize an optional plated Ni barrier layer applied via an electroless plating technique. Such techniques can provide a barrier layer between the Cu and Ag, thereby preventing Cu atoms from migrating into the Ag plating. LED device 50 can comprise one or more LED chips 52 arranged over a conductive pad, generally designated 54. The one or more LED chips 52 can comprise LED chips having similar wavelengths of light, for example, comprising a certain targeted wavelength bin. In the alternative, LED chips 52 can comprise a plurality of chips wherein at least one of the LED chips 52 is a different wavelength, for example, selected from a different targeted wavelength bin than another LED chip of the plurality. In one aspect, LED chips 52 selected for use can comprise wavelengths targeting cool white (CW) or warm white (WW) light upon, for example, mixing with light emitted from a phosphor as described earlier.

Conductive pad 54 can comprise any suitable electrically conductive material or substrate such as a Cu substrate. Conductive pad 54 can comprise one or more electrically separated mounting portions separated via gaps generally designated 55 disposed between the one or more portions. In one aspect, one LED chip 52 is mounted to a single isolated portion of conductive pad 54. In one aspect LED chip 52 can directly attach to conductive pad 54, in other aspects, LED chip 52 can be provided over but indirectly attach to conductive pad 54. That is, LED chips 52 can directly attach to one or more layers (e.g., 80 and/or 82, see FIGS. 8A to 8E). It is also contemplated that two or more LED chips 52 could also be mounted to a single isolated portion of conductive pad 54. Device 50 can further comprise first and second electrically conductive traces 56 and 58, respectively, for passing electrical current or signal into and out of the one or more LED chips 52. Conductive pad 54 can be centrally disposed between first and second traces 56 and 58, and can comprise portions formed integral with and/or electrically isolated from traces 56 and 58. First and second conductive traces 56 and 58 can comprise portions of the same Cu substrate from which conductive pad 54 is formed. Conductive traces 56 and 58 can be electrically isolated from conductive pad 54 via gaps 55 created by etching or other Cu removal process (e.g., similar to traces 33 and 34 which have been separated from conductive pad 30 as described above, see FIGS. 3 to 5). In general, conductive pad 54 and first and second conductive traces 56 and 58 can be arranged and/or attached over an upper surface of a substrate or submount 60.

LED chips 52 can comprise one or more wire bond pads disposed on a top surface of LED chip 52 for sending and/or receiving electrical current via electrical connectors. During operation, an electrical signal or current can pass from first and second conductive traces 56 and 58 into and out of LED chips 52 via electrical connectors such as wire bonds 26. Conductive traces 56 and 58 can receive electrical current from one or more surface mount pads (e.g., 70 and 72, FIG. 7) disposed on a bottom surface of submount 60. Such surface mount pads 70 and 72 (FIG. 7) can electrically attach and communicate to an external electrical component (not shown), such as a power or driving circuit. LED chips 52 can comprise a vertical structure or build where the bottom of the chip comprises an anode electrically communicating with first conductive trace 56, and the top of the chip comprises a cathode (e.g., in the form of one or more bond pads) which electrically communicate with second conductive trace 58. Device 50 could also be configured for incorporating horizontally structured devices (e.g., with electrical contacts on the same side, for example, a bottom side) such that wire bonds 26 are not necessary. The one or more LED chips 52 can mount or die attach to conductive pad 54 via any suitable method(s) and/or material(s), for example, such as via a conductive epoxy, silicone epoxy, Ag epoxy, solder paste, preforms, flux eutectic materials or dispensed polymeric materials and methods of using the same, each of which can electrically and/or thermally connect LED chips 52 to conductive pad 54.

Still referring to FIGS. 6 and 7, LED device 50 can comprise submount 60 which can comprise any suitable material. In one aspect, submount 60 can comprise an electrically insulating material. For example, such materials can comprise, but are not limited to, ceramic materials such as aluminum oxide ($Al_2O_3$), aluminum nitride (AlN), or organic insulators like polyimide (PI), polyamide (PA), polyphthalamide (PPA), and/or combinations thereof. In other embodiments submount 60 can comprise a PCB, sapphire, silicon, or any other suitable material, such as T-Clad thermal clad insulated substrate material, available for example from The Bergquist Company of Chanhassen, Minn. For PCB embodiments, different PCB types can be used such as standard FR-4 PCB, a MCPCB (e.g., as described in FIG. 5), or any other type of printed circuit board.

Submount 60 can comprise a top surface 62 on or over which the conductive pad 54 and first and second conductive traces 56 and 58 can be disposed. The one or more LED chips 52 can mount at or approximate a center of the device 50 under a lens 64. The size of submount 60 can vary depending on different factors, with one being the size of the LED chips 52. For example, the size of submount 60 in device 50 can comprise essentially the same dimension as the effective heat spreading area in conductive pad 54 and first and second conductive traces 56 and 58, respectively. For example, in devices having four 1 mm LED chips, the submount 32 can measure approximately 5 mm by 5 mm. Also for example, in a device having four 0.7 mm chips, submount 32 can measure approximately 3.5 mm by 3.5 mm. The approximate 5 mm and 3.5 mm submount sizes are exemplary and not exhaustive. There can be more or less than 4 LED chips and submount 60 can be smaller or larger than approximately 700 µm or 1 mm per side, respectively. For example, submount 60 sizes of approximately 2 mm×2 mm or 8 mm×8 mm are possible. This is assuming LED chips 52 comprise a generally square shape. However, any of the LED chips 52 can also be rectangular or any shape other than rectangular or square. It is further understood that submount 60 can comprise any suitable shape including circular, triangular, rectangular, or other multiple sided shape(s).

An ESD protection device 66 can be disposed within device 50 and can be electrically connected to first and second conductive traces 56 and 58 such that it is reverse biased with respect to the one or more LED chips 52. Different electrical elements can be used as ESD devices 66, such as various vertical silicon (Si) Zener diodes, different LED chips arranged in parallel and reverse biased to LED chips 52, surface mount varistors, and lateral Si diodes. In the embodiments shown, a Zener diode can be utilized and mounted over conductive pad 54 using known mounting techniques. ESD protection device 66 can be relatively small such that it does not cover an excessive area on the surface of the submount 60 or block a significant amount of light emitted from the LED chips 52. ESD protection device 66 can also be positioned close to the edge of a lens 64 such that it cannot block light from a center of the device.

LED devices 50 can further comprise optical elements, for example, a lens 64 and a protective layer 68. Optical elements such as lens 64 and protective layer 68 can be formed over top surface 62 of submount 60 and over the one or more LED chips 52. Lens 64 and protective layer 68 can provide both environmental and/or mechanical protection of device 50. Lens 64 can extend to different locations over top surface 62 of submount 60, for example, as shown where LED chips 52 are substantially centrally disposed below a center of the lens base. In other aspects, lens 64 can extend such that LED chips 52 are not centrally disposed below a center of the lens base, for example, but are to one side of the lens base. Protective layer 68 can extend to the edges of device 50 and can measure approximately the same in length and width as submount 60 for providing protection of device components which extend proximate the edges of submount 60, such as traces 56 and 58. In some embodiments, lens 64 can be formed in direct contact with LED chips 52 and/or top surface 62 of the submount 60. In other embodiments there can be an intervening material or layer, such as encapsulant and/or phosphors disposed between the lens 64 and LED chips 52 and/or top surface 62. Direct contact to the LED chips 52 may provide certain advantages such as improved light extraction and ease of fabrication.

Lens 64 can be molded using different molding techniques and the lens can be many different shapes depending on the desired shape of the light output. Protective layer 68 can comprise a layer of silicone remaining between adjacent lenses 64 which can be molded over adjacent submounts 60 during manufacture of device 50. One suitable shape for lens 64 can comprise a hemispheric shape having a substantially circular lens base as shown, with some examples of alternative shapes being ellipsoid bullet, flat, hex-shaped, oval, and square. Many different materials can be used for the lens such as silicones, plastics, epoxies or glass, with a suitable material being compatible with molding processes. Silicone can be suitable for molding and provides suitable optical transmission properties. It can also withstand subsequent reflow processes and does not significantly degrade over time. It is understood that lens 64 can also be textured and/or used in combination with a diffusing layer to improve light extraction or can contain materials such as phosphors or scattering particles.

FIG. 7 is a cross-sectional view of device 50. In this view, surface mount pads 70 and 72 can be seen disposed essentially vertically below first and second conductive traces 56 and 58, respectively. A current or electrical signal can be applied to the device through surface mount pads 70 and 72 from an external source (not shown) when device mounts to the external source. For example, first and second surface mount pads 70 and 72 can electrically communicate to solder contacts or other conductive paths located on an external source, and pass current into first and second conductive traces 56 and 58, respectively. An external source can comprise a printed circuit board PCB, metal core printed circuit board (MCPCB) or any other suitable external source capable of passing current into device 50. In the embodiment shown, LED device 50 can be arranged for mounting using surface mount technology and device 50 can comprise internal conductive paths defined by one or more conductive vias 74.

Device 50 can further comprise a thermal element 76 optionally disposed between first and second surface mount pads 70 and 72, respectively. In one aspect, thermal element 76 is disposed in a central location of submount 60 below the one or more LED chips 52. Thermal element 76 can comprise any thermally conductive material, such as a metal or metal alloy and can be in at least partial vertical alignment with the LED chips 52. In one embodiment, thermal element 76 is electrically isolated from electrical elements 56 and 58 on top surface 62 of submount 60 as well as first and second surface mount pads 70 and 72 on bottom surface of submount 60. Although heat from LED chips 52 can laterally spread over top surface 62 of submount 60 via conductive pad 54 and conductive traces 56 and 58, more heat can pass into submount 60 directly below and around LED chips 52. Thermal element 76 can assist with heat dissipation by allowing heat to spread into thermal element 72 where it can dissipate more readily from the device. For devices used in surface mount technology, the thickness of thermal element 76 and first and second surface mount pads 70 and 72 can be approximately the same such that all three make contact to a lateral surface such as a PCB. To improve wetting of the solder however, and to ensure a more robust contact between thermal element 76 and an external heat sink, thermal element 76 may extend away from the body of the device to a greater distance than surface mount pads 70 and 72. That is, it is contemplated that thermal element 76 can be thicker than surface mount pads 70 and 72.

One or more conductive vias 74 can extend through submount 60 between first surface mount pad 70 and first electrical element 56 such that when a signal is applied to the first surface mount pad 70 it is conducted through submount 60 and into first electrical element 56. Similarly, one or more conductive vias 74 can be formed extending between second surface mount pad 72 second electrical element 58 for communicating an electrical signal between the two. Conductive vias 74 and surface mount pads 70 and 72 can comprise any suitable electrically conducting material. It is understood that surface mount pads 70 and 72 and conductive vias 74 can be arranged in many different configurations and can therefore comprise any suitable shape(s) and/or size(s). Conductive vias 56 can form between respective surface mount pads 70 and 72 and conductive traces 56 and 58 which may not be substantially vertically arranged, but could be arranged at an angle within submount 60. It is also understood that instead of vias, one or more intervening metal layers or internal traces can be provided between one or more surfaces of the submount 60 between the surface mount pads 70 and 72 and conductive traces 56 and 58, and/or even along external side surfaces of submount 60 between respective surface mount pads 70 and 72 and electrical elements 56 and 58.

Notably and as FIG. 7 further illustrates, device 50 can comprise an optional layer of solder mask 32 material. The upper surface of solder mask 32 is illustrated in broken lines as it is optional. The circled detail 8A-E is also circled in FIG. 5 and is described further below in FIGS. 8A to 8E. That is, devices 10 and 50 can incorporate novel plated substrates as shown and described in FIGS. 8A to 8E below. Solder mask 32 can comprise conventional materials which can be reflective and disposed over portions of conductive pad 54 and traces 56 and 58. Solder mask 32 can also be disposed within one or more gaps 55 such that it can directly adhere to top surface 62 of submount 60 (e.g., FIGS. 8A to 8E). Solder mask 32 can protect the electrical components (e.g., pad 54 and traces 56 and 58) from the environment during subsequent processing steps and in particular mounting LED chips 52 to conductive pad 54 and wire bonding. During these steps there can be a danger of solder or other materials depositing in undesired areas, which can result in damage to the areas and/or can result in electrical shorting of the device. Solder mask 32 can provide an insulated and protective covering or material for reducing and/or preventing such dangers. Solder mask 32 can comprise an opening for mounting LED chips 52 over conductive pad 54 and for attaching wire bonds 26 to second electrical trace 58. Solder mask 32 can also comprise side openings allowing convenient electrical access to conductive traces 56 and 58 for testing the devices during fabrication.

The devices disclosed in FIGS. 1 through 7 have been described to provide context for further embodiments of the subject matter which are described hereinafter. For example, lighting devices 10 and 50 (and device 90, FIGS. 9 to 10B) can incorporate one or more novel plated substrates and related methods as described hereinbelow. FIGS. 8A to 8E are exploded views of the details circled in FIGS. 5 and 7. As described earlier and as illustrated in FIG. 7, solder mask 32 can be an optional layer.

Figure 8A:
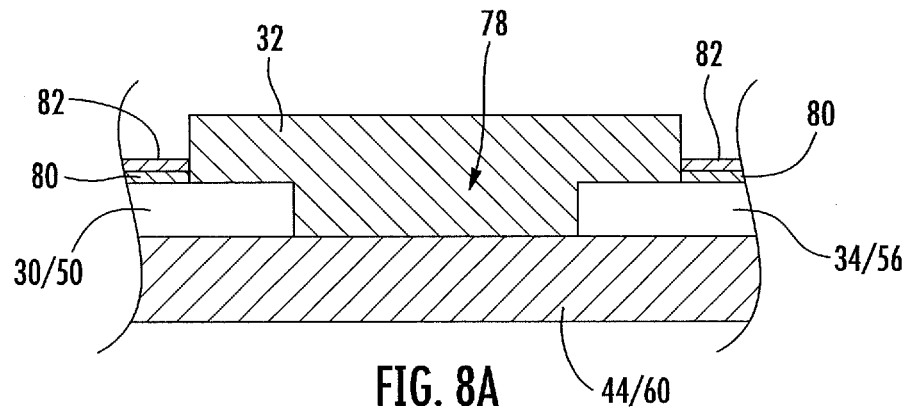
FIGS. 8A through 8E are cross-sectional views of LED devices according to the disclosure herein.

FIG. 8A illustrates a plated substrate or component, for example, a plated Cu substrate of an LED device (e.g. devices 10, 50, and 90 having Cu substrates comprising a single Cu substrate in which pad 30 or 54 and traces 34 or 56 can be patterned or formed via etching). The Cu substrate can be deposited over a submount or a layer of a submount, such as dielectric layer 44 or submount 60. The Cu substrate can comprise a single layer of material that has been deposited and subsequently etched such that conductive pad 30 or 54 is electrically isolated from conductive trace 34 or 56. Etching can remove portions of the Cu substrate such that a gap generally designated 78 is disposed between conductive pad 30 or 54 and conductive trace 34 or 56.

In some aspects, a reflective, non-metallic (e.g., plastic or polymeric) material such as a reflective solder mask 32 can be deposited at least partially in gap 78 between conductive pad 30 or 54 and conductive trace 34 or 56. Solder mask 32 can be used to protect underlying Cu components from degradation or oxidation and can also be used for improving reflection and, therefore, light extraction from devices described herein. Portions of solder mask 32 can directly adhere to portions of Cu (e.g., pad 30 or 54 and/or trace 34 or 56) and portions of dielectric layer 44 or submount 60. In some aspects, solder mask 32 can comprise a white, silver, or silver white color and can be highly reflective for advantageously improving light extraction from devices described herein.

A first, barrier layer of material 80 can be plated via an electroless plating process after addition, such as by deposition or dispensing, of solder mask 32. A second, reflective layer of material 82 can be deposited over first layer of material 80 via an immersion plating process. In one aspect, first layer of material 80 can comprise or be a layer of electroless Ni and second layer 82 can comprise or be a layer of immersion Ag. First layer 80 can provide a Ni barrier layer between the Cu substrate components (e.g., conductive pad 30 or 54 and conductive trace 34 or 56) and the Ag substrate or layer (e.g., second layer 82). The Ni barrier layer can advantageously prevent Cu atoms from migrating into the Ag second layer 82 which can lead to a defect known as the "red plague." This defect can adversely affect brightness of LED devices incorporating plated components. In some aspects, second layer 82 can comprise a highly reflective metallic layer, such as a Ag layer which can advantageously increase the brightness of LED devices incorporating the plated components, as it is highly reflective and can reflect light from the surfaces within the device.

Second layer 82 can comprise a layer of Ag that can be approximately 0.1 μm to 1 μm thick, and any sub range of thickness between approximately 0.1 μm and 1 μm is contemplated. For example, second layer 82 can comprise a layer of Ag that is approximately 0.1 to 0.3 μm; 0.3 to 0.5 μm; 0.5 to 0.8 μm; and 0.8 to 1 μm. Thicknesses that are less than approximately 0.1 μm can also be used and are also contemplated herein, however, the overall brightness increase of the LED device incorporating the plated components may not be as notable. Thicknesses that are greater than approximately 1 μm can also be used; however, it may be more difficult to plate thicker layers via the immersion technique. Any thickness of first layer 80 is contemplated herein.

Electroless plating, also known as chemical or autocatalytic plating, is a non-galvanic (e.g., non-electrolytic) type of plating method involving several simultaneous reactions in an aqueous solution and occurring without the use of external electrical power. During immersion plating processes, an immersion plating solution operates on the principal of displacement such that a metal on an outer surface of the substrate is replaced by a more noble metal that is in solution. In one aspect, a layer of Cu can first be deposited over first layer 80 which can later become displaced by Ag atoms via immersion plating. First layer 80 can, but does not have to, comprise Ni, and any suitable metal or material for providing a barrier between Cu and Ag is contemplated for use in first layer 80.

Notably, first and second layers 80 and 82 can become plated in areas where it will subsequently remain, that is, the layers may not need to be subsequently etched. This can advantageously conserve materials, reduce waste, and reduce the cost of producing LED devices incorporating plated components. Immersion plating can also reduce the need for subsequent etching steps, which may further increase time and cost associated with manufacturing LED devices. Electroless Ni plating processes are not widely known or used in the semiconductor industry as controlling the thickness of a layer plated via electroless plating processes can be difficult. Notably, devices, plated substrates, and related methods described herein unexpectedly incorporate electroless Ni plating within the LED device, and obtain the unexpected results of obtaining a barrier layer of adequate thickness between Cu and Ag components. Also of note, electroless and immersion plating processes do not involve chemicals that will damage or degrade solder mask 32 which is a current concern for manufacturers of conventional plated substrates, devices, and/or related methods.

Figure 8B:
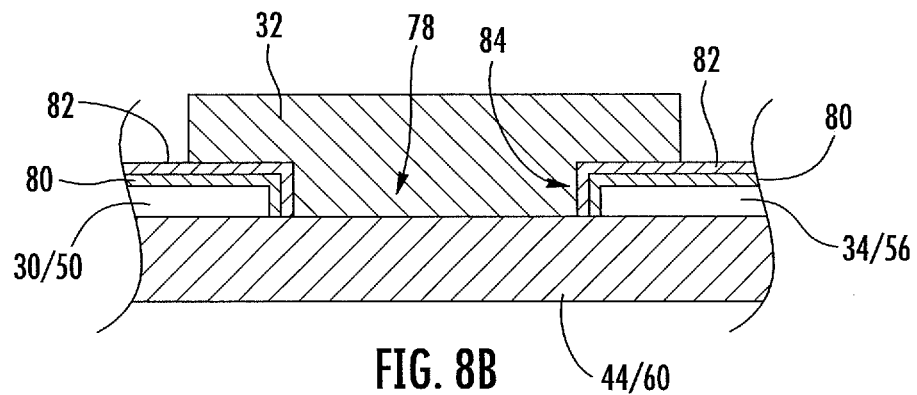

FIG. 8B illustrates another embodiment of plated substrates or components for use in LED devices described herein. As FIG. 8B illustrates, first and second layers 80 and 82, respectively, can be deposited or plated prior to application of solder mask 32 and after Cu components have been deposited and/or etched. First and second layers 80 and 82 can be plated such that they cover one or more vertical edge portions 84 of Cu components (e.g., pad 30 or 54 and traces 34 or 56). Portions of first and second layers 80 and 82, respectively, can directly adhere to portions of dielectric layer 44 or submount 60. Portions of first and second layers 80 and 82, respectively, can also directly adhere to edge portions 84 of Cu components. In one aspect, first layer 80 can comprise a Ni barrier layer plated via an electroless Ni plating process. In one aspect, second layer 82 can comprise a reflective layer of Ag that can be plated via any one of an electrolytic, electroless, or immersion plating process. In one aspect, first layer of material 80 comprises a layer of electroless Ni and second layer 82 comprises a layer of immersion Ag. Notably, first and second layers 80 and 82 can be plated before application of solder mask 32 such that any damage to solder mask that may result from the plating processes can be avoided. Solder mask 32 can optionally be applied or deposited after layers 80 and 82 have been applied, such that a portion of solder mask 32 deposits within gap 78 between the plated edge portions generally designated 84 of the Cu components.

Figure 8C:
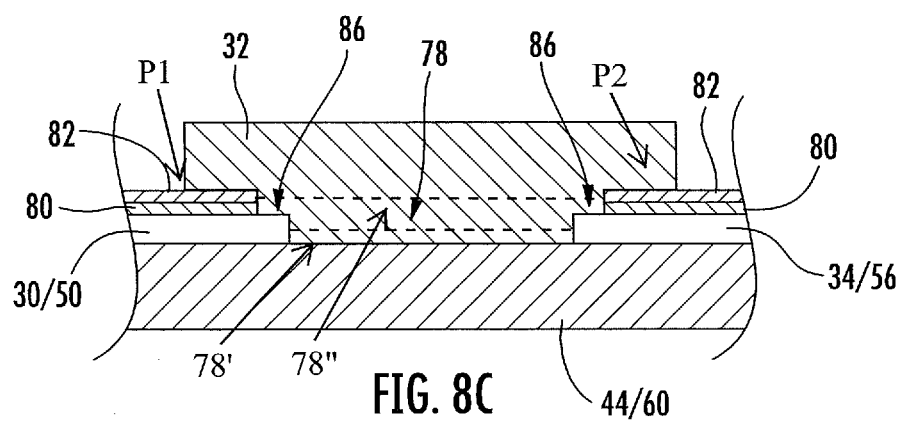
Figure 8D:
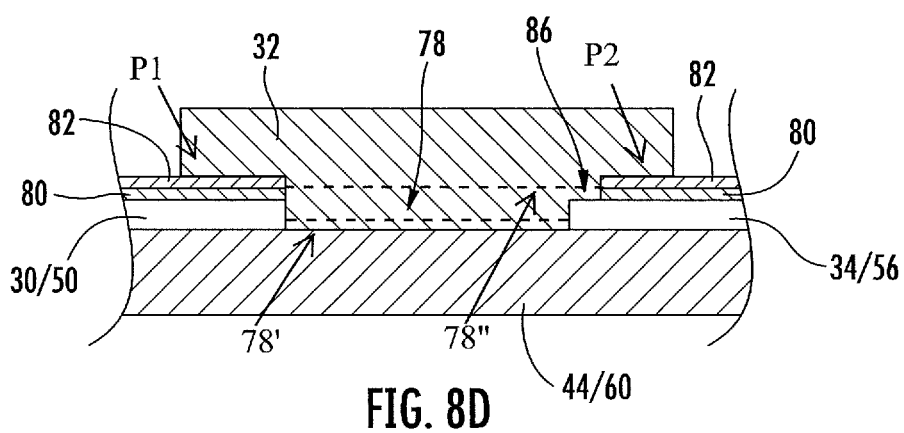

FIGS. 8C and 8D illustrate selective plating and etching of first and second layers 80 and 82, respectively. Referring to FIG. 8C, first and second layers 80 and 82 can be plated over a uniform (e.g., non-etched) Cu substrate via electrolytic, electroless, or immersion plating techniques. In a first step, a first photomask can be applied and patterned in a shape that is the same as or slightly larger than the area to be exposed in the final product. A first etching step can fully remove portions of first and second layers 80 and 82 (e.g., Ag and Ni), respectively, such that a horizontally disposed gap forms between a first portion P1 of first and second layers 80 and 82 and a second portion P2 of first and second layers 80 and 82. The first etching step can leave behind the exposed and underlying Cu substrate.

In some aspects, after the first initial etch, a second photomask patterned in the shape of the electrical traces (e.g., traces 34 or 56 and pads 30 or 54) can be applied and the Cu can be fully etched to form a second gap and expose portions of dielectric layer 44 or submount 60 within the gap. As a result of the differential etching, underlying Cu layers, (e.g., conductive pad 30 or 54 and traces 34 or 56) can extend further in length and/or comprise a greater surface area than the metallic barrier and reflective layers (e.g., first and second layers 80 and 82, respectively). That is, in some aspects gap 78 can comprise two portions, where a first portion 78' or first gap between Cu components (e.g., between pad 30 and trace 34), the width of which is indicated in broken lines, can be smaller in width than a second portion 78" or second gap between first and second layers 80 and 82, the width of which is also indicated in broken lines.

In some aspects, the first and second differential etching steps can be performed prior to deposition of solder mask 32, such that upon deposition, solder mask 32 can directly adhere to portions of each of the underlying layers including second layer 82, Cu components (e.g., pad 30 or 54 and traces 34 or 56), and dielectric layer 44 or submount 60. Gaps or offsets generally designated 86 may be present between one or more etched layers such that solder mask 32 can overlap or extend slightly and directly over portions of Cu substrate (e.g., pad 30 or 54 and traces 34 or 56) to allow for slight variations in mask registration. Notably, with respect to selective plating and/or etching described with respect to FIGS. 8C and 8D, first and second layers 80 and 82 can be plated before application of solder mask 32 such that any damage to solder mask that may result from the plating processes can be avoided.

Similarly, FIG. 8D illustrates another embodiment where selective plating or etching techniques have been applied, such that offset 86 can be disposed at one side of the differentially etched metal stack. In one aspect and prior to application of solder mask 32, first and second layers 80 and 82 can be plated over a uniform (e.g., non-etched) Cu substrate via electrolytic, electroless, and/or immersion plating techniques. In a first step, a first photomask can be applied and patterned in a shape that is the same as or slightly larger than the area to be exposed. A first etching step can then fully remove portions of first and second layers 80 and 82 (e.g., Ag and Ni), respectively, such that a gap forms between a first portion P1 and a second portion P2 of first and second layers 80 and 82, such that the layers on either side of the gap are of a substantially same dimension or length on either side of the Cu substrates. The first etching step can leave behind the exposed and underlying Cu substrate.

In some aspects, after the first initial etch, a second photomask patterned in the shape of the normal electrical traces (e.g., traces 34 or 56 and pads 30 or 54) can be applied and the Cu can be fully etched to form a second gap and expose portions of dielectric layer 44 or submount 60 within the second gap. As a result of the differential etching, a portion of the underlying Cu layers, (e.g., conductive pad 30 or 54 and traces 34 or 56) can extend further in length at side of the trace edge than the barrier and reflective layers as seen by offset generally designated 86. That is, gap 78 can comprise multiple portions of variable width, where a first portion 78' or first gap between Cu components (e.g., between pad 30 and trace 34) can comprise a smaller width (indicated in broken lines) than a second portion 78" or second gap between first and second layers 80 and 82 (the width of which is indicated in broken lines).

In some aspects, a highly reflective non-metallic material such as solder mask 32 can optionally and subsequently be applied after the etching steps such that a portion of solder mask 32 directly adheres to portions of each of the underlying layers including second layer 82, Cu components (e.g., pad 30 or 54 and traces 34 or 56), and dielectric layer 44 or submount 60. One gap or offset 86 can be present between one or more etched layers such that solder mask 32 can overlap or extend slightly and directly over portions of Cu substrate (e.g., pad 30 or 54 and traces 34 or 56) to allow for slight variations in mask registration.

Figure 8E:
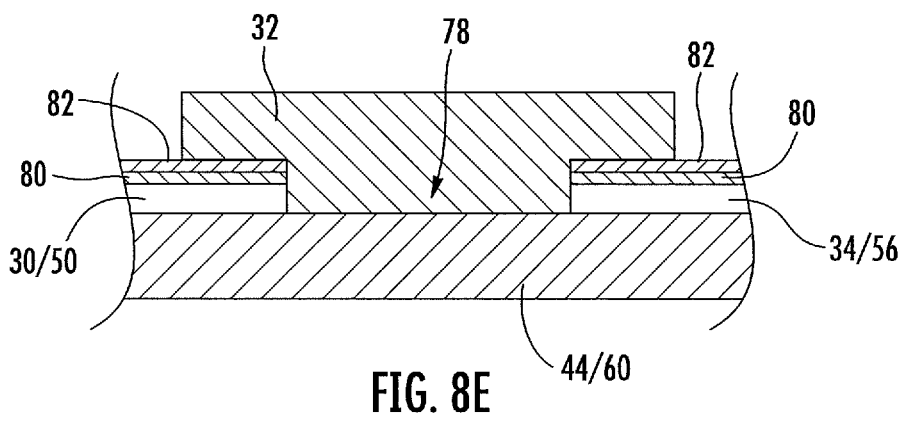

FIG. 8E illustrates another embodiment where first and second layers 80 and 82 have been applied prior to application of solder mask 32. First and second layers can be applied via any one of an electrolytic, electroless, or immersion plating process. In one aspect, first layer of material 80 can comprise a first metallic layer, such as a barrier layer of electroless Ni. In some aspects, a second metallic layer that is reflective, such as second layer 82 can comprise a layer of immersion Ag. First and second layers 80 and 82 can be plated over Cu substrate prior to etching or separation of Cu into pad 30 or 54 and trace 34 or 56. That is, first and second layers 80 and 82 as well as Cu substrate can be etched during the same and/or different steps such that each layer has at least substantially the same length or dimension (e.g., no offsets 86). As a result, solder mask 32 can be applied such that a portion deposits in gap 78 which is left after the etching step(s), and such that a portion of solder mask 32 directly adheres to dielectric layer 44 or submount 60. Notably, first and second layers 80 and 82 can be plated before application of solder mask 32 such that any damage to solder mask that may result from the plating processes can be avoided.

For illustration purposes only, two plated layers 80 and 82 have been shown and described in FIGS. 8A to 8E. However, only one (e.g., only Ag layer 82 or only barrier layer 80) or more than two layers are also contemplated herein. In one aspect, layers 80 and 82 can be repeatedly layered multiple times over Cu substrates. As FIGS. 8A to 8E illustrate an exploded detail of conductive pad 30 or 54, were the portions extended it would be seen that LED chips 25 or 52 (FIGS. 5 and 6) can be disposed over portions of first and/or second layers 80 and 82 and die attached to such layer(s) via any suitable die attach method and/or material as described herein. FIGS. 8A to 8E also illustrate solder mask 32. Solder mask 32 is an optional layer or step (e.g., see FIG. 7, 32 is in broken lines). To avoid an unnecessary number of similar illustrations, multiple embodiments without solder mask 32 (e.g., FIGS. 8A to 8B without layer 32) are not show. However, such embodiments are contemplated herein.

Figure 9:
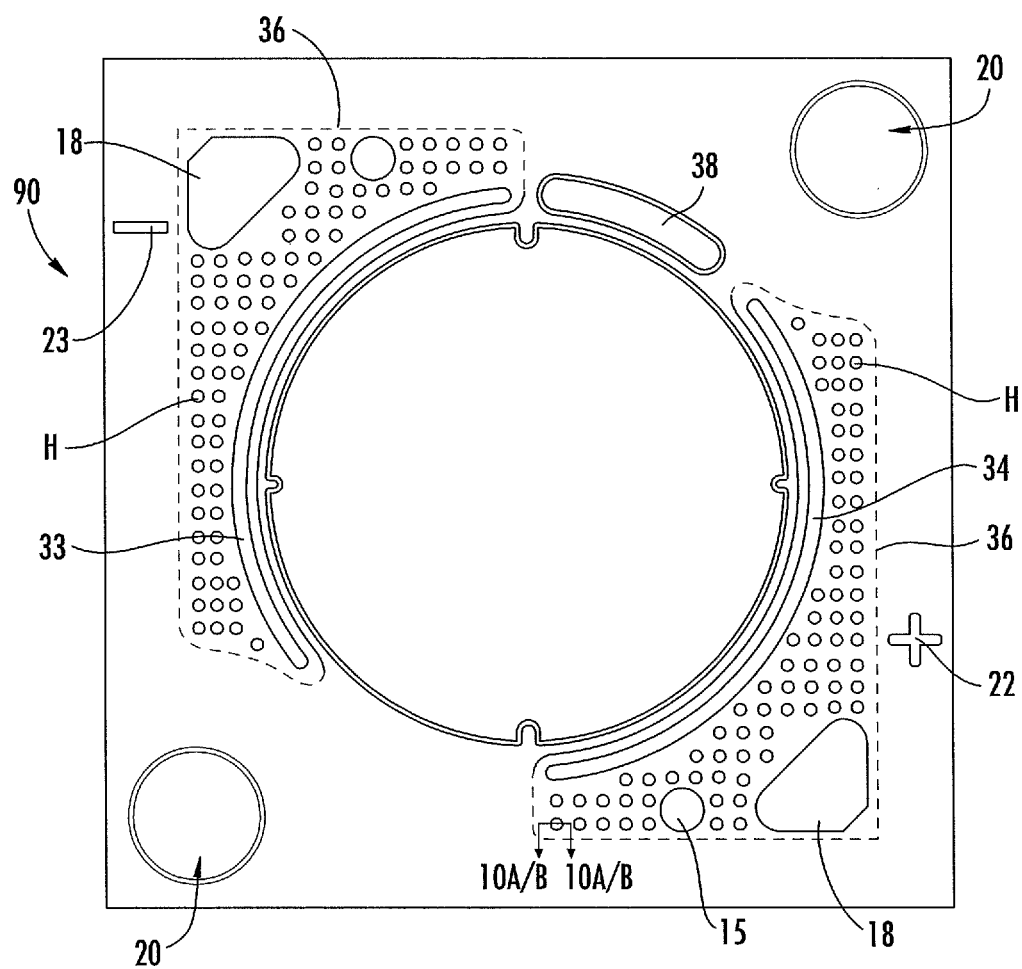
FIG. 9 is a top view of the LED device according to FIG. 1 illustrating plated portions of the device according to the disclosure herein.
Figure 10A:
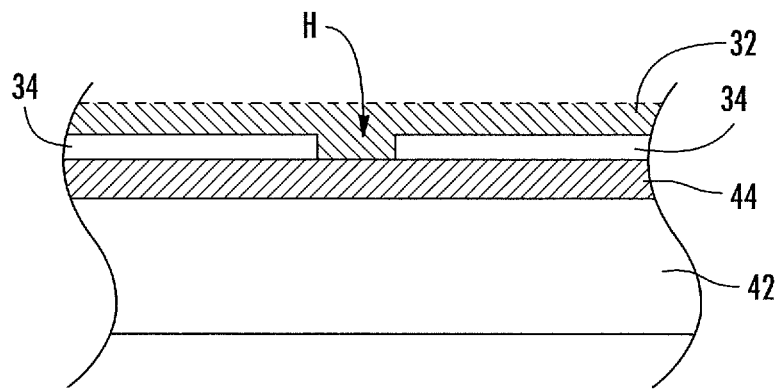
FIGS. 10A and 10B are cross-sectional views of the light emitting device according to FIG. 9.
Figure 10B:
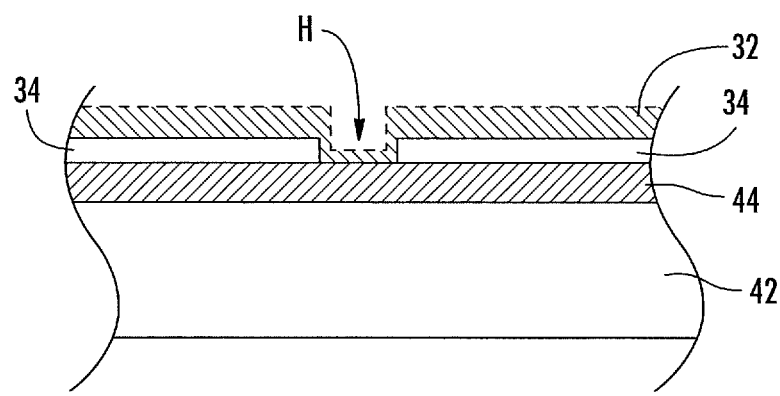

FIG. 9 illustrates another embodiment and top views of an LED device, generally designated 90. LED device 90 illustrates portions of the device prior to placement of retention material 14, solder mask 32, and/or filling material 40. FIGS. 10A and 10B illustrate a cross-sectional view of a portion of device 90 and possible locations of solder mask 32, as designated by the broken lines. LED device 90 is similar in form and function to previously described device 10, one exception being the addition of anchor points or holes H. Anchor points or holes H can be disposed within LED device 90 and can be used in combination with and incorporate plated surfaces and layers 80 and 82 as previously shown and described with respect to FIGS. 8A to 8E.

The one or more "anchor points" or holes H can provide improved adhesion within LED device 90. In one aspect, the one or more anchor points or holes H can comprise areas of material that have been partially or completely etched prior to application of the solder mask 32 (FIGS. 10A and 10B). First and second layers 80 and 82 (not shown) can be deposited prior to and/or after deposition of solder mask 32, sequentially etched, and/or deposited prior to or after etching of Cu components within device 90 as previously described in FIGS. 8A to 8E. Holes H can facilitate better adhesion of layers within device 90 as solder mask 32 can adhere better directly to portions of dielectric layer 44 (FIGS. 10A and 10B) and/or Cu components (e.g., conductive pad 30 and traces 33, 34) than intervening first and second layers (e.g., 80 and 82, FIGS. 8A to 8E).

In one aspect, holes H are substantially circular; however, holes H can for example and without limitation comprise any shape such as circles, squares, stars, symmetric polygons, asymmetric polygons, or combinations thereof. Holes H can be any size or shape and can be placed in any pattern and/or in any quantity to fit within a designated area 36 which can be disposed below solder mask 32 (FIGS. 10A and 10B). For example, holes H can comprise a matrix, a grid pattern, a random pattern, or can be disposed only along the edges of a designated area (e.g., area within broken lines 36), or any combination thereof. Holes H can be randomly scattered, densely packed, sparsely packed, and/or positioned in any combination thereof. In one aspect, holes H can comprise a diameter of approximately 1.5 to 10 times the thickness of the Cu components (e.g., traces 33, 34 and pad 30) and can comprise a period (e.g., spacing between holes H) that is approximately twice the depth as the holes H. For example, and in one aspect, Cu traces 34 can have a thickness of approximately 3 oz. (approximately 0.105 mm), and holes H can have a diameter of approximately 0.3 millimeters (mm) and a period, or inter-hole spacing of approximately 0.6 mm. Different ranges and sub-ranges of hole H period and depth are contemplated.

LED device 90 is similar to device 10 in that it can comprise a conductive pad 30 and first and second conductive traces 33 and 34 which can comprise a layer of electrically conductive material such as Cu. Conductive pad 30 and conductive traces 33 and 34 can comprise Cu substrates or components plated with Ag and optionally plated with a Ni barrier layer disposed between the Cu and Ag as previously described in FIGS. 8A to 8E. Notably, Ag can be plated via electrolytic, electroless, and/or immersion plating techniques at different stages during the manufacturing process of device 90. An optional Ni barrier layer can be plated via an electroless process. In one aspect, plating techniques can advantageously plate Ag and Ni only in areas corresponding to portions of the device where it will ultimately remain and/or be required, thereby reducing waste. In addition, such plating can be performed prior to application of solder mask 32, such that cleaning and/or plating chemicals do not degrade such components of LED device 90.

Still referring to FIGS. 9 to 10B and as previously described, attachment areas 18 can electrically communicate to respective conductive traces 33 and/or 34. In one aspect, attachment areas 18 can comprise a Cu substrate that can be or have the same layer and/or same substrate as that of the Cu traces 33 and 34. One possible size and/or shape of the Cu substrate can be designated by broken lines 36. Such lines 36 are broken to indicate portions of the Cu substrate which can be disposed below a layer of solder mask 32 (see e.g., FIGS. 10A and 10B).

Attachment areas 18 can electrically connect to external wires (not shown) and can transfer electrical current received from such wires into and out of respective conductive traces 33 and 34. Conductive traces 33 and 34 can transfer electrical current into and out of one or more LED chips (not shown), or a string of LED chips via electrical connectors such as wire bonds thereby causing illumination of the one or more LED chips or the string of chips. In one aspect, conductive pad 30 can also comprise the same substrate or layer of Cu material as traces 33, 34 and attachment areas 18. However, traces 33 and 34 can be electrically isolated and physically separated from conductive pad 30 via etching or other Cu removal process.

Attachment areas 18, traces 33 and 34, conductive pad 30, and test point 15 can comprise areas of exposed Cu. That is, attachment areas 18, traces 33 and 34, conductive pad 30, and test point 15 can comprise areas of Cu which are disposed on an upper surface of device 10 and which are not disposed below another layer of material, such as below a solder mask 32. Such exposed areas can physically and electrical connect to electrical components or devices, including but not limited to electrical wires (not shown), wire bonds, or LED chips (see e.g., FIGS. 3 and 4).

FIGS. 10A and 10B are cross-sectional views along the line 10A/B in FIG. 9. FIGS. 10A and 10B illustrate solder mask 32 in broken lines as it has yet to be deposited in FIG. 9, but is used to show different locations and configurations of solder mask 32 that can be deposited over device 90. For example and as illustrated in FIG. 10A, solder mask 32 can completely be disposed within hole H such that the thickness of solder mask 32 varies from a thinner layer over conductive trace 34 to a thicker layer the depth of hole H. FIG. 10B illustrates solder mask 32 having a uniform thickness over each of the conductive trace 34 and within hole H, such that the overall upper surface of device 90 can have a rough, texturized, or bumpy surface. First and second layers 80 and 82 of material (e.g., Ag and/or Ni shown and described in FIGS. 8A to 8E) can be plated, deposited, and/or subsequently etched such that the layers are disposed over and/or between surfaces of conductive trace 34 and solder mask 32 as previously shown and described in FIGS. 8A to 8E. Such layers are not repeatedly shown and described in FIGS. 10A and 10B in efforts to reduce the number of repetitive Figures herein.

As FIGS. 10A and 10B illustrate, holes H can act as anchor points for improving adhesion of solder mask 32 within device. That is, holes H can provide areas where solder mask 32 can directly adhere to portions of dielectric layer 44, as adhesion between solder mask 32 and dielectric layer 44 is improved over adhesion between solder mask 32 and other Cu, Ag, and/or Ni layers, substrates, or components. In one aspect, solder mask 32 can flow into and become disposed inside holes H and directly adhere to an upper surface of dielectric layer 44. This improves adherence of solder mask 32 within LED device 90. In addition to direct adhesion between solder mask 32 and dielectric layer 44, solder mask 32 can also adhere directly to side portions of conductive trace 34 and/or first and second layers 80, 82 (see e.g., FIGS. 8A to 8E), each of which alone and/or together can form side walls of each hole H. In one aspect, dielectric layer 44 comprises a PCB dielectric material, for example, a thermally conductive dielectric layer disposed over core layer 42. However, any suitable dielectric material may be used.

Embodiments of the present disclosure shown in the drawings and described above are exemplary of numerous embodiments that can be made within the scope of the appended claims. It is contemplated that the configurations of LED devices having improved brightness via plated components and methods of making the same can comprise numerous configurations other than those specifically disclosed.

What is claimed is:
1. A light emitting device comprising:
a copper (Cu) substrate;
a first metallic layer comprising a reflective metal disposed over the Cu substrate for increasing brightness of the device, wherein the first metallic layer comprises silver (Ag);

a second metallic layer disposed between the Cu substrate and the first metallic layer for forming a diffusion barrier therebetween, wherein the second metallic layer contacts portions of the Cu substrate and the first metallic layer; and one or more light emitting diode (LED) chips disposed over the Cu substrate, wherein the Cu substrate comprises one or more electrically conductive traces and a conductive pad over which the first and second metallic layers are disposed, wherein a pap is disposed between the one or more electrically conductive traces and the conductive pad, wherein the gap between the conductive pad and the one or more electrically conductive traces is smaller in width than a second gap between portions of the first and second metallic layers disposed over each of the conductive pad and the one or more electrically conductive traces.

2. The device of claim 1, wherein the second metallic layer comprises electroless nickel (Ni).

3. The device of claim 1, wherein the first and second metallic layers are disposed over a vertical edge portion of the conductive pad or the one or more electrically conductive traces.

4. The device of claim 1, further comprising a layer of non-metallic reflective material disposed over and contacting a portion of the first metallic layer.

5. The device of claim 4, wherein the non-metallic reflective material comprises solder mask.

6. The device of claim 1, further comprising a layer of solder mask disposed over a portion of the second metallic layer.

7. The device of claim 1, wherein a retention material is disposed around the one or more LED chips.

8. The device of claim 7, wherein an encapsulant filling material is disposed within an inner wall of the retention material.

9. The device of claim 8, wherein one or more phosphors are disposed in the encapsulant.

10. The device of claim 1, further comprising a ceramic substrate over which the Cu substrate is disposed.

11. The device of claim 10, wherein one or more conductive vias are disposed through the ceramic substrate and electrically communicate with the Cu substrate.

12. The device of claim 10, further comprising a lens disposed over the one or more LED chips.

13. A light emitting device comprising:

a copper (Cu) substrate comprising one or more electrically conductive traces and a conductive pad over which first and second metallic layers are disposed;

the first metallic layer comprising a reflective metal disposed over the Cu substrate for increasing brightness of the device;

the second metallic layer disposed between the Cu substrate and the first metallic layer for forming a diffusion barrier therebetween, wherein the second metallic layer contacts portions of the Cu substrate and the first metallic layer; and one or more light emitting diode (LED) chips disposed over the Cu substrate;

wherein a first gap is disposed between the one or more electrically conductive traces and the conductive pad, and wherein the first gap between the conductive pad and the one or more electrically conductive traces is smaller in width than a second gap between portions of the first and second metallic layers disposed over each of the conductive pad and the one or more electrically conductive traces.

* * * * *